US009915717B2

(12) United States Patent
Ugurbil

(10) Patent No.: US 9,915,717 B2
(45) Date of Patent: Mar. 13, 2018

(54) METHOD FOR RAPID WHOLE BRAIN MAGNETIC RESONANCE IMAGING WITH CONTRAST PREPARATION

(75) Inventor: Kamil Ugurbil, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 1177 days.

(21) Appl. No.: 13/995,869

(22) PCT Filed: Dec. 20, 2011

(86) PCT No.: PCT/US2011/066072
§ 371 (c)(1),
(2), (4) Date: Sep. 5, 2013

(87) PCT Pub. No.: WO2012/088060
PCT Pub. Date: Jun. 28, 2012

(65) Prior Publication Data
US 2013/0342206 A1 Dec. 26, 2013

Related U.S. Application Data

(60) Provisional application No. 61/425,046, filed on Dec. 20, 2010.

(51) Int. Cl.
*G01V 3/00* (2006.01)
*G01R 33/561* (2006.01)
(Continued)

(52) U.S. Cl.
CPC ....... *G01R 33/561* (2013.01); *G01R 33/4835* (2013.01); *G01R 33/5602* (2013.01)

(58) Field of Classification Search
CPC .. A61B 5/055; G01R 33/4828; G01R 33/543; G01R 33/5608
(Continued)

(56) References Cited

U.S. PATENT DOCUMENTS 5,633,586 A 5/1997 Finn
6,498,946 B1 12/2002 Foo et al.
(Continued)

FOREIGN PATENT DOCUMENTS

EP 0 213 858 3/1987
EP 2 116 859 11/2009
WO WO 2010019790 A2 * 2/2010 ............. A61B 5/022

OTHER PUBLICATIONS

The International Search Report dated Apr. 3, 2012 for International Application No. PCT/US2011/066072.
(Continued)

*Primary Examiner* — Walter L Lindsay, Jr.
*Assistant Examiner* — Frederick Wenderoth
(74) *Attorney, Agent, or Firm* — Quarles & Brady LLP

(57) ABSTRACT

A method for acquiring image data from a plurality of slice locations in a subject with a magnetic resonance imaging (MRI) system is provided. The method includes directing the MRI system to perform a pulse sequence that includes performing a contrast preparation module configured to generate contrast-encoded longitudinal magnetization and an image encoding module configured to acquire image data from multiple slice locations substantially simultaneously. The contrast preparation module generally includes tipping longitudinal magnetization into the transverse plane to produce transverse magnetization, generating contrast-prepared transverse magnetization by establishing an image contrast in the transverse magnetization, and tipping the contrast-prepared magnetization back along the longitudinal axis to produce the contrast-encoded longitudinal magnetization.

19 Claims, 10 Drawing Sheets

(51) Int. Cl.
    *G01R 33/483*      (2006.01)
    *G01R 33/56*       (2006.01)
(58) Field of Classification Search
    USPC .......................................................... 324/309
    See application file for complete search history.

(56) References Cited

U.S. PATENT DOCUMENTS

| | | | | |
|---|---|---|---|---|
| 6,614,225 B1* | 9/2003 | Feinberg | ............ | G01R 33/4835 |
| | | | | 324/307 |
| 7,511,493 B2* | 3/2009 | Green | ................ | G01R 33/5613 |
| | | | | 324/307 |
| 2004/0000907 A1* | 1/2004 | Ahluwalia | ......... | G01R 33/3415 |
| | | | | 324/309 |
| 2010/0085046 A1* | 4/2010 | Larson | ................ | G01R 33/485 |
| | | | | 324/307 |

OTHER PUBLICATIONS

Stainsby, J.A., et al., "Segmented T2-Prepared SSFP for Myocardial T2-Weighted Imaging and T2-Mapping," ISMRM-ESMRMB Joint Annual Meeting Proceedings, May 3, 2010, Stockholm, Sweden, XP002671954.

* cited by examiner

METHOD FOR RAPID WHOLE BRAIN MAGNETIC RESONANCE IMAGING WITH CONTRAST PREPARATION

CROSS-REFERENCE TO RELATED APPLICATIONS

This application represents the U.S. National Stage of International Application No. PCT/US2011/066072, filed Dec. 20, 2011 which claims the benefit of, and incorporates by reference U.S. Provisional Patent Application Ser. No. 61/425,046 filed on Dec. 20, 2011 and entitled "An Approach to Rapid Whole Brain Coverage with Contrast Preparation."

STATEMENT REGARDING FEDERALLY SPONSORED RESEARCH

This invention was made with government support under RR008079 and MH091657 awarded by National Institutes of Health. The government has certain rights in the invention.

BACKGROUND OF THE INVENTION

The field of the invention is systems and methods for magnetic resonance imaging ("MRI"). More particularly, the invention relates to systems and methods for rapid whole brain MRI.

In the last two decades, MRI techniques such as functional magnetic resonance imaging ("fMRI") and diffusion weighted imaging ("DWI"), either for neuronal fiber tractography or for diffusion weighted diagnosis, such as in stroke, have revolutionized the ability of clinicians and scientists to investigate the human brain. These techniques mostly rely on echo planar imaging ("EPI") or spiral sampling techniques for spatial encoding of the magnetic resonance image because of their fast scan times.

With contemporary scanner hardware, a single EPI or spiral image of a two-dimensional imaging slice can be obtained in tens of milliseconds and can be repeated at adjacent slice locations for coverage of a desired imaging volume, typically requiring on the order of 2-6 seconds for whole brain imaging, depending on the slice thickness and inter-slice gaps, if any. More specifically, an imaging slice of a desired thickness, such as a millimeter to a few millimeters, along one direction is excited with a frequency-selective radio frequency ("RF") pulse. Subsequently, the image of this slice is encoded in the plane orthogonal to the slice direction with an EPI, spiral, gradient and spin echo ("GRASE"), fast or turbo spin echo, or other analogous ultra-fast imaging techniques, which use spatial encoding through phase modulation induced by magnetic field gradients. These approaches allow the plane perpendicular to the slice-selection direction to be spatially encoded after the single, slice-selective excitation. Thus, these methods are commonly referred to as "single-shot" techniques. In the aforementioned imaging techniques, slice excitation is followed by the formation of multiple echoes to generate a single echo train that encodes the two-dimensional image. The rapid two-dimensional image acquisition following the slice excitation is repeated in other locations so as to generate a "multi-slice" image of the entire desired imaging volume, such as the whole human brain.

Since its initial application, scan time volume coverage for ultra-fast imaging techniques, such as those described above, has not substantially decreased. For example, nearly all the successful efforts to shorten EPI acquisition times have targeted reducing the number of refocused echoes needed for spatial encoding to form an image, by means of method such as partial Fourier imaging, parallel imaging, or sparse data sampling techniques. Although these approaches decrease scan time for spatial encoding, they do not necessarily reduce the time required for image acquisitions by a significant amount. This is because a physiological contrast preparation period, such as for neuronal activity or water diffusion, must precede the spatial encoding period for each slice. Notably, this contrast preparation period can equal or exceed the time employed for collecting the EPI echo train.

Three-dimensional echo volume imaging ("EVI") extends the EPI principle to three dimensions, and eliminates the separate slice excitations, thereby avoiding the need to repeat the contrast preparation period. Thus, EVI allows for a single contrast preparation period to be followed with a three-dimensional volume coverage in a single echo train. However, this approach has severe limitations in spatial resolution and image quality due to the longer echo trains needed to fully encode the volumetric spatial information in the relatively short acquisition period. Thus, these EVI techniques suffer from distortions and blurring on two of the three image axes, as well as a loss in signal-to-noise ratio ("SNR"). Multi-shot three-dimensional techniques, such as those based on EPI, that have produced high quality images overcome this limitation, albeit at the expense of longer acquisition times than can be achieved with EVI or single-shot three-dimensional GRASE sequences. Echo shifting approaches, such as principles of echo shifting using a Train of observations ("PRESTO"), increase volume coverage efficiency by taking advantage of echo time delays to apply additional RF pulses; however, these techniques are SNR limited and run into restrictions at higher magnetic fields when T2 and T2* become inherently short.

It would therefore be desirable to provide a method for rapidly imaging a significant imaging volume, such as the whole human brain, without the loss of spatial resolution and image quality, including signal-to-noise ratio, contrary to existing methods such as those mentioned above.

SUMMARY OF THE INVENTION

The present invention overcomes the aforementioned drawbacks by providing a method for performing magnetic resonance imaging ("MRI") in which a single contrast preparation is performed substantially simultaneously in multiple slice locations prior to a rapid image encoding that is capable of producing high spatial resolution images of a significant imaging volume, such as a whole human brain.

It is an aspect of the invention to provide a method for substantially simultaneously acquiring image data from a plurality of slice locations in a subject with an MRI system. Image data is substantially simultaneously acquired from a plurality of slice locations contained in a plurality of subvolumes, which form a part of a volume-of-interest in the subject. The MRI system is directed to a pulse sequence that includes a contrast preparation module that is configured to generate contrast-prepared magnetization substantially simultaneously in the plurality of subvolumes by applying at least one multiband radio frequency ("RF") pulse to the volume-of-interest. The pulse sequence also includes an image encoding module that is configured to acquire image data substantially simultaneously from the plurality of slice locations contained in the plurality of subvolumes. By way of the contrast preparation module, the acquired image data has an image contrast indicated by the contrast-prepared magnetization. The image encoding module may include spatial and temporal multiplexing strategies to rapidly acquire image data from the plurality of slice locations. An example of a spatial multiplexing strategy includes using multiband RF excitation of the plurality of slice locations, and an example of a temporal multiplexing strategy includes simultaneous image refocusing ("SIR").

It is another aspect of the invention to provide an MRI system that includes a magnet system configured to generate a polarizing magnetic field about at least a portion of a subject arranged in the MRI system, a plurality of gradient coils configured to apply at least one gradient field to the polarizing magnetic field, and an RF system configured to apply an RF field to the subject and to acquire magnetic resonance ("MR") image data therefrom. The MRI system also includes a computer system that is programmed to direct the MRI system to perform a contrast preparation pulse sequence module that generates contrast-prepared magnetization substantially simultaneously in a plurality of subvolumes in a volume-of-interest by directing the RF system to apply at least one multiband RF pulse to the volume-of-interest and the plurality of gradient coils to apply at least one gradient field to the polarizing magnetic field so that the at least one multiband RF pulse generates the contrast-prepared magnetization in the plurality of subvolumes. The computer system is also programmed to direct the MRI system to perform an image encoding pulse sequence module that acquires image data substantially simultaneously from a plurality of slice locations contained in the plurality of subvolumes. This acquired image data has an image contrast indicated by the contrast-prepared magnetization.

The foregoing and other aspects and advantages of the invention will appear from the following description. In the description, reference is made to the accompanying drawings which form a part hereof, and in which there is shown by way of illustration at least one preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
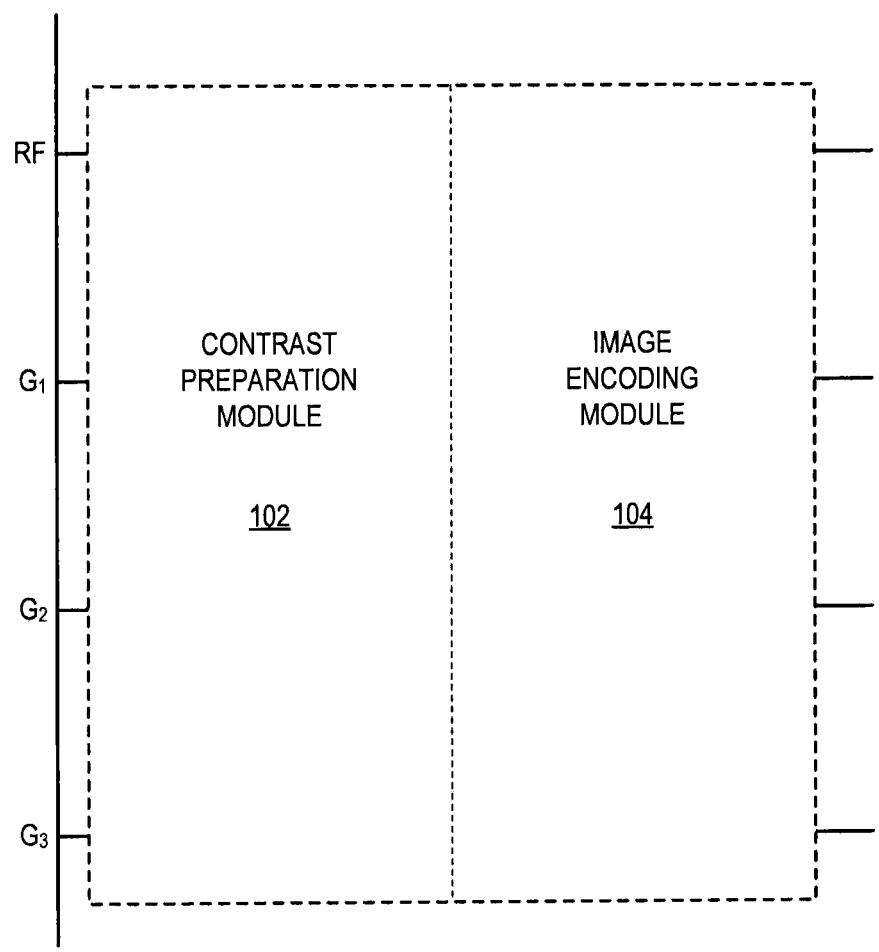
FIG. 1 is a pulse sequence diagram generally illustrating a contrast preparation module and an image encoding module, as employed when performing methods of the present invention.

Methods are provided for accelerating the acquisition of images from large volumes using a common contrast preparation module that "stores" image contrast along the longitudinal axis followed by a rapid multi-slice acquisition without additional contrast preparation during the relatively short lifetime of the contrast-prepared magnetization. In general, the methods include performing an MRI pulse sequence, such as the one generally illustrated in FIG. 1, which includes a contrast preparation module 102 and an image encoding module 104. In general, the gradient axes depicted in FIG. 1 are as follows: the gradient axis $G_1$ corresponds to a slice selection axis that is perpendicular to the plane of an imaging slice, and the gradient axes $G_2$ and $G_3$ correspond to spatial encoding axes oriented within the plane of the imaging slice. By way of example, for axial imaging $G_1$ is oriented along the z-axis and $G_2$ and $G_3$ are interchangeably oriented along the x-axis and the y-axis.

An example of a contrast preparation module 102 includes a pulse sequence module in which radio frequency ("RF") pulses and magnetic field gradients are employed to generate an image contrast in transverse magnetization. The contrast prepared transverse magnetization is then returned to the longitudinal axis, thereby encoding in longitudinal magnetization the image contrast prepared in transverse magnetization. The longer spin-lattice, or longitudinal, relaxation time associated with the evolution of longitudinal magnetization towards thermal equilibrium then allows for the rapid acquisition of image data from the contrast encoded longitudinal magnetization. In this manner, the image contrast originally encoded in transverse magnetization can be read out rapidly from the longitudinal magnetization. Traditionally, only $T_1$ contrast is prepared and stored along the longitudinal axis; however, the aforementioned method operates in a distinctly different manner than from conventional $T_1$-weighted imaging sequences. Particularly, the contrast preparation is performed in the transverse plane, and this established image contrast is subsequently stored along the longitudinal axis, thereby generating contrast-prepared or contrast-encoded longitudinal magnetization. A discussion of several different examples of contrast preparation pulse sequence modules employed in accordance with methods of the present invention are provided below.

In addition to generating contrast in transverse magnetization that is subsequently stored in longitudinal magnetization, the contrast preparation module 102 may also include a pulse sequence that is configured to generate contrast directly in the longitudinal magnetization, such as a $T_1$-related contrast. A discussion of examples of contrast preparation pulse sequence modules that may be employed to achieve such a contrast preparation is also provided below.

In addition to the aforementioned approach, the image encoding module may also incorporate an additional and different contrast during data acquisition, which will slow down the acquisition, but may provide additional information.

In traditional contrast preparations, contrast is generally prepared only in the particular slice to be imaged, and the contrast preparation must be repeated when acquiring image data from each subsequent slice location in the volume-of-interest. Such an approach is time consuming, as it requires the repetition of the lengthy contrast preparation sequence before image encoding each subsequent slice location. By utilizing multiband RF pulses for contrast preparation, image encoding, or both, more efficient contrast preparations can be realized.

Figure 2A:
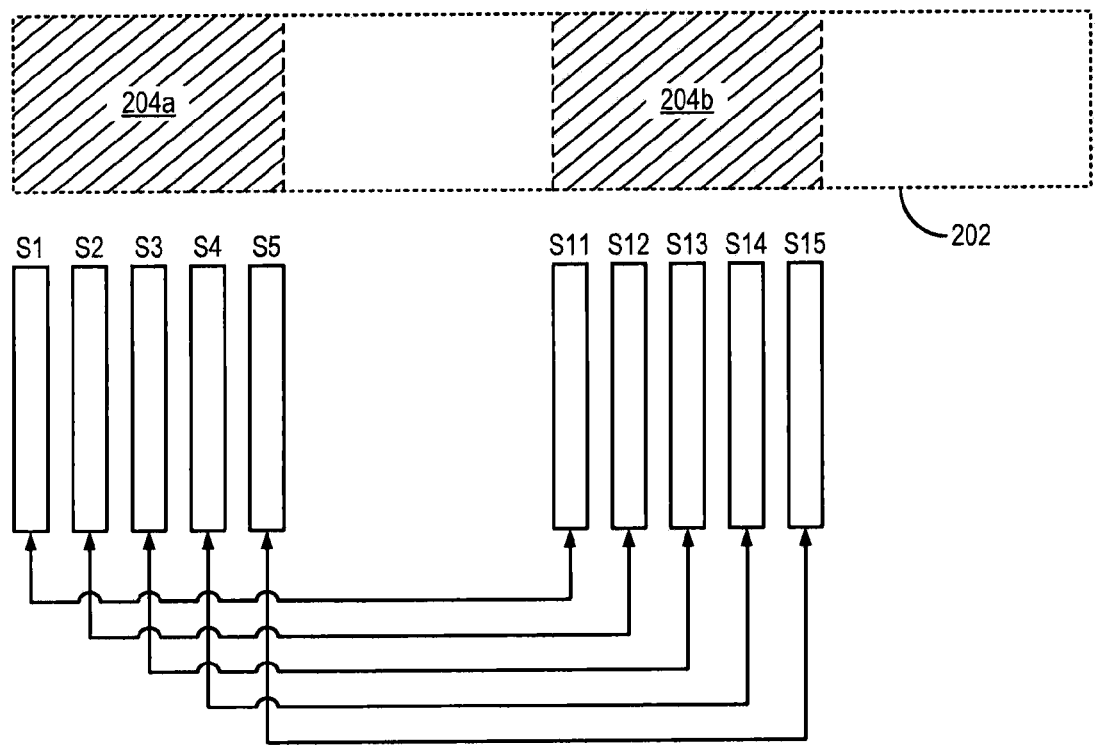
FIGS. 2A and 2B are pictorial representations of a volume-of-interest containing subvolumes, in which image contrast is substantially simultaneously prepared using multiband radio frequency ("RF") pulses.
Figure 2B:
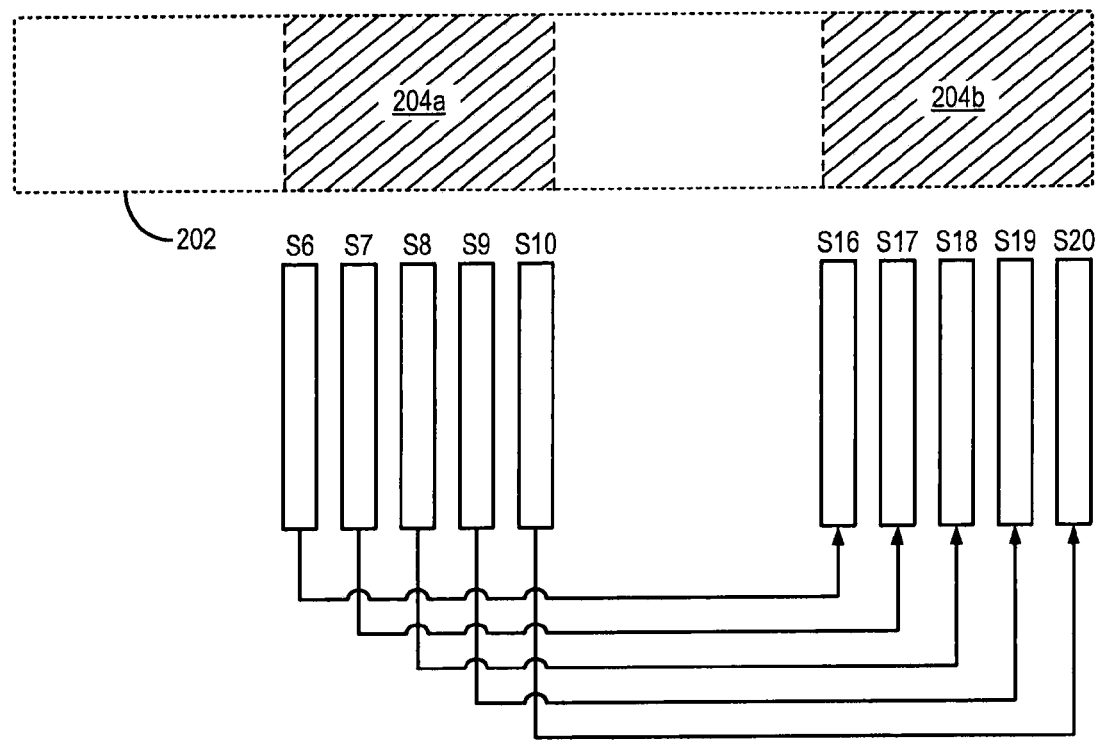

By way of example, and referring now to FIGS. 2A and 2B, a multiband contrast preparation and image encoding, in which a volume-of-interest 202 containing twenty slice locations is imaged, is generally illustrated. In FIG. 2A, a multiband contrast preparation sequence is performed to prepare image contrast in two subvolumes 204a, 204b of the volume-of-interest. For example, the subvolumes 204a, 204b may be "slabs," as the term is used in the art. This contrast preparation is followed by the performance of an image encoding sequence, in which image data from ten of the twenty slice locations is acquired. Images are obtained in pairs using a multiband image encoding, as indicated by the lines connecting the slice pairs. For example, slices S1 and S11 are obtained together, slices S2 and S12 are obtained together, and so on. It is further noted that the multiband image encoding can be modified in accordance with simultaneous echo refocusing ("SER") or simultaneous image refocusing ("SIR") techniques, whereby each slice location illustrated in FIG. 2A will actually correspond to multiple adjacent slice locations. For example, using a multiband SIR technique, slice S1 would actually correspond to n adjacent slice locations $\{S1_1, \ldots, S1_n\}$. To obtain images over the entire volume-of-interest 202, the contrast preparation and image encoding are repeated but spatially shifted to cover the remainder of the volume-of-interest, as illustrated in FIG. 2B. For example, in FIG. 2B, the subvolumes 204a, 204b cover portions of the volume-of-interest containing slice locations S5-S10 and S15-S20.

The preceding example in FIGS. 2A and 2B is illustrative only. For example, the contrast preparation may be performed in more than two subvolumes, and any suitable number of slice locations may be substantially simultaneously imaged, as defined by the appropriate multiband RF pulses and capabilities of the RF receiver coil array to provide spatial information for unaliasing imaging slices that have been substantially simultaneously acquired. Using multiband RF pulses, contrast preparation can be substantially simultaneously performed for multiple slice locations. In this manner, the total data acquisition time period can be significantly reduced not only because a single contrast preparation period is utilized for an image encoding that obtains images for multiple slice locations, but because the contrast preparation itself is specifically tailored only to those multiple slice locations that will be sampled by the image encoding, thus, there is no idle time between repetition time periods waiting for magnetization to fully recover back to thermal equilibrium.

Having described the general benefits of methods of the present invention, a discussion of different contrast preparation pulse sequence modules is now provided. As a first example, $T_1$-weighting may be achieved using a multiband RF pulse followed by a suitable delay time, during which the differing longitudinal relaxation characteristics of different spin systems are allowed to evolve to generate an image contrast stored in longitudinal magnetization. Residual magnetization in the transverse plane may be suppressed by "crusher" gradients so that only longitudinal magnetization is left to be detected by the subsequent image encoding module. By way of example, such contrast preparation modules may include multiband RF pulses that provide inversion of the bulk magnetization, a saturation of the magnetization, or the general rotation of the bulk magnetization through an arbitrary flip angle. As noted above, the multiband RF pulse is tailored to substantially simultaneously affect multiple subvolumes of a volume-of-interest. In general, such subvolumes will include multiple slice locations.

Figure 3A:
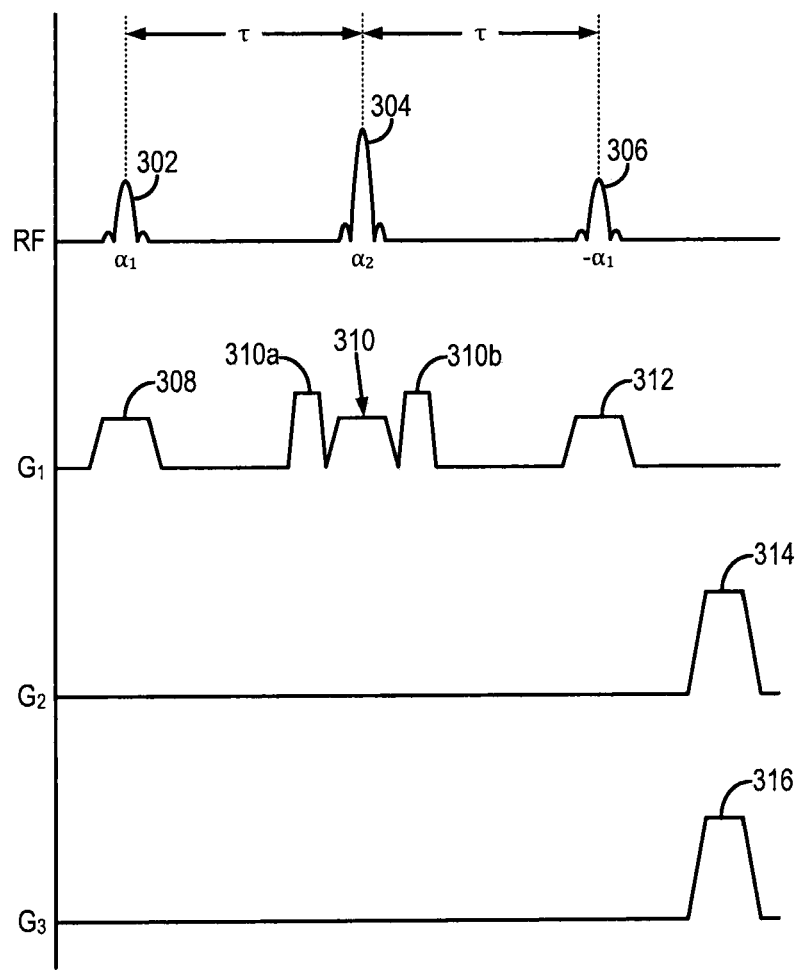
FIGS. 3A-3F are pulse sequence diagrams illustrating examples of contrast preparation modules that may be employed when practicing embodiments of the invention.

Referring now to FIG. 3A, an example of a contrast preparation module that may be used to encode $T_2$-weighting in longitudinal magnetization is illustrated. The contrast module begins with the application of a first multiband RF pulse 302 having a flip angle, $\alpha_1$. As noted Agrees; however, other flip angles, such as 120 degrees, may also be employed even though such flip angles will result in non-optimal refocusing. Then, after another delay period, $\tau$, a second multiband RF pulse 306 is applied, but the flip angle of this second multiband RF pulse 306 is $-\alpha_1$; thus, the second multiband RF pulse 306 is equal to the first multiband RF pulse 302, but applied with a 180 degree phase shift. This second multiband RF pulse 306 is applied to the same subvolumes as the first multiband RF pulse 302 and the multiband RF refocusing pulse 304. This contrast module may be reported as a $[\alpha_1\text{-}\tau\text{-}\alpha_2\text{-}\tau\text{-}(-\alpha_1)]$ module. As illustrated in FIG. 3A, the first multiband RF pulse 302, refocusing RF pulse 304, and second RF pulse 306 are played out in the presence of selective gradients 308, 310, and 312, respectively. The selective gradient 310 played out in the presence of the multiband refocusing RF pulse 304 is preferably bridged by crusher gradients 310a, 310b, which act to remove any unwanted signal that may accrue during the application of the multiband refocusing RF pulse 304. By way of example, the flip angle, $\alpha_1$, may be ninety degrees so that the longitudinal magnetization is fully rotated into the transverse plane at the beginning of the contrast preparation module.

The spin evolution during the preceding contrast module is as follows. The first RF multiband pulse 302 tips longitudinal magnetization into the transverse plane where, during the first delay period, magnetic field inhomogeneities, as well as any gradients that may be applied during this delay period, cause the spins to dephase according to the transverse relaxation time constant, $T_2$. Thus, after the first delay period, $\tau$, the transverse magnetization has decayed by a factor of:

$$e^{-\tau/T_2} \quad (1).$$

The multiband refocusing RF pulse 304 reverses the spin evolution, which refocuses the dephasing induced by the magnetic field inhomogeneities. As a result, the transverse magnetization is brought back into phase after the time period, $\tau$, following the application of the multiband refocusing RF pulse 304. Following this second delay period, the transverse magnetization has decayed by a factor of:

$$e^{-2\tau/T_2} \quad (2).$$

If the transverse magnetization arises from regions with different $T_2$ values, this decay will impart a spatially dependent $T_2$ contrast on the transverse magnetization. The effect of the second multiband RF pulse 306 on this transverse magnetization is to rotate the transverse magnetization back along the longitudinal axis. The contrast module concludes with the application of crusher gradients 314, 316, which are applied to crush any residual magnetization remaining in the transverse plane following the application of the second multiband RF pulse 306.

The net result of the contrast module is that the $T_2$-weighting generated in the transverse magnetization is transferred to and stored in longitudinal magnetization. This longitudinal magnetization evolves towards thermal equilibrium magnetization with the longitudinal relaxation time constant, $T_1$, which is orders of magnitude slower than $T_2$. Thus, for periods of time that are short compared to $T_1$, the generated $T_2$ contrast will be preserved in the longitudinal magnetization, and this embedded $T_2$ contrast can be sampled with subsequent data acquisition and image encoding.

Figure 3B:
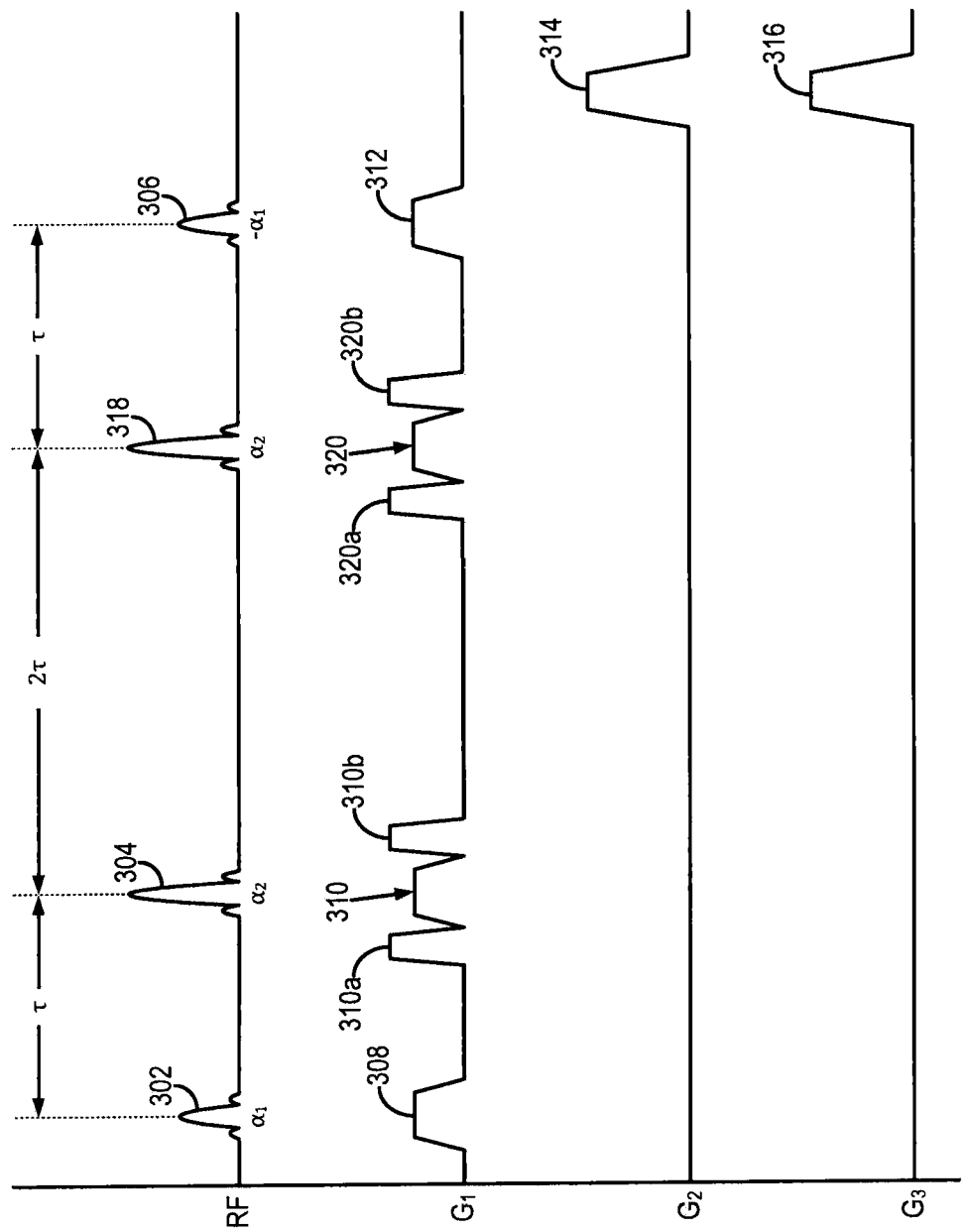

Referring now to FIG. 3B, another example of a contrast preparation module that may be used to encode $T_2$-weighting in longitudinal magnetization is illustrated. This contrast module begins with the application of a first multiband RF pulse 302, which is followed by a first time period $\tau$ in duration. After this first delay period, a first multiband refocusing RF pulse 304 is applied. Now, however, a second time period $2\tau$ in duration is allowed to pass before a second multiband refocusing RF pulse 318 is applied. After the application of this second multiband refocusing RF pulse 318, a third time period $\tau$ in duration is allowed to pass, after which a second multiband RF pulse 306 is applied. As with the contrast preparation module illustrated in FIG. 3A, the first multiband RF pulse 302 has a flip angle of $\alpha_1$ and the second multiband RF pulse has a flip angle of $-\alpha_1$. Thus, this contrast preparation module may be reported as a $[\alpha_1\text{-}\tau\text{-}\alpha_2\text{-}2\tau\text{-}\alpha_2\text{-}\tau\text{-}(-\alpha_1)]$. Similar to the contrast preparation module illustrated in FIG. 3A, the first multiband RF pulse 302, first multiband refocusing RF pulse 304, second multiband refocusing RF pulse 318, and second multiband RF pulse 306 are played out in the presence of selective gradients 308, 310, 320, and 312, respectively. Similar to the contrast preparation module illustrated in FIG. 3A, the selective gradients 310 and 320 played out in the presence of the first multiband refocusing RF pulse 304 and the second multiband refocusing RF pulse 318, respectively, are bridged by crusher gradients 310a, 310b and 320a, 320b, respectively.

The preceding contrast preparation module beneficially allows for the use of spatially-selective, multiband adiabatic inversion pulses for the first multiband refocusing RF pulse 304 and the second multiband refocusing RF pulse 318. In general, multiband adiabatic inversion pulses have excellent slice-selective or slab-selective profiles; however, each of these multiband adiabatic inversion pulses imparts a phase dispersion that depends on the specifics of the multiband RF pulse itself. For example, the duration, magnitude, and off-resonance of the multiband RF pulses may impart a phase dispersion. Thus, by using two multiband refocusing RF pulses, as illustrated in FIG. 3B, the respective phase dispersions imparted by each multiband refocusing RF pulse will cancel each other, thereby resulting in the desired transformation back to the longitudinal axis.

It is noted that the first multiband refocusing RF pulse 304, second delay time period of $2\tau$ duration, and second multiband refocusing RF pulse 318 may be repeated n-times before the third delay time period and second multiband RF pulse 306 are performed. Such a contrast module may be reported as a $[\alpha_1\text{-}\tau\text{-}(\alpha_2\text{-}2\tau\text{-}\alpha_2)_n\text{-}\tau\text{-}(-\alpha_1)]$ module. This type of contrast preparation will produce a $T_2$-weighting that will have diminished effects of diffusion in the presence of magnetic field inhomogeneities.

Figure 3C:
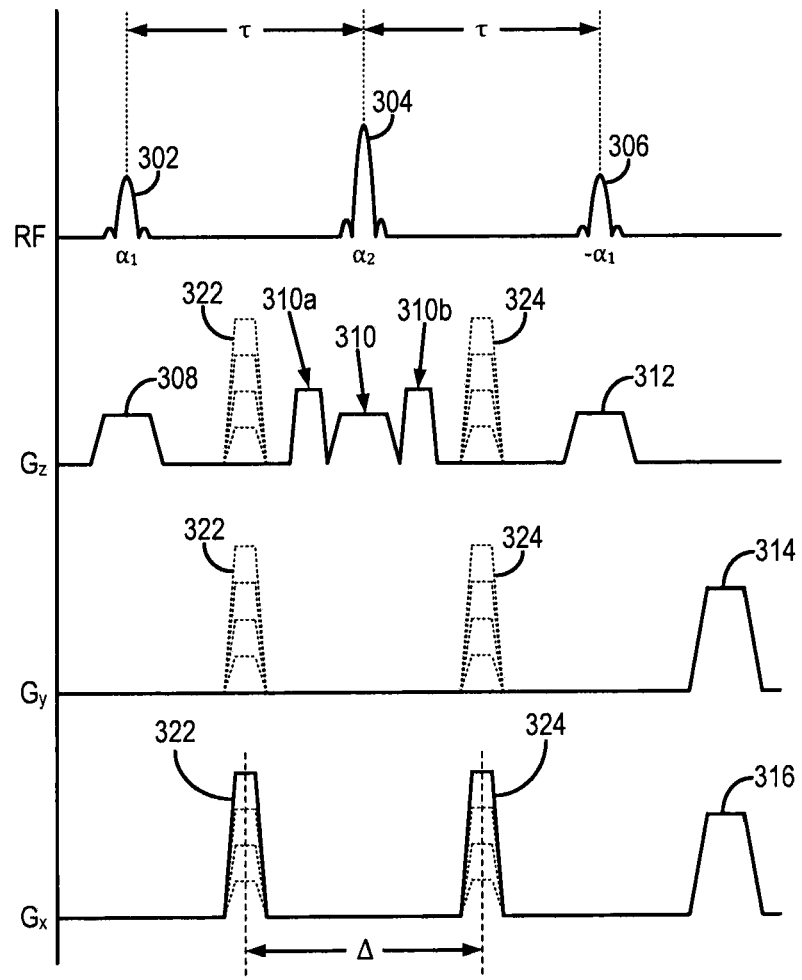

Referring now to FIG. 3C, an example of a contrast preparation module that may be used to encode diffusion-weighting in longitudinal magnetization is illustrated. As shown in FIG. 3C, this contrast preparation module may be substantially similar to that illustrated in FIG. 3A, but for the inclusion of diffusion-encoding gradients 322 and 324, which are respectively played out along any one of the three gradient axes or combinations thereof before and after the refocusing RF pulse 304 so as to sensitize any transverse magnetization to diffusion occurring along a direction defined by the diffusion-encoding gradients 322, 324. By using these diffusion-encoding gradients 322, 324, the longitudinal magnetization existing at the conclusion of the contrast preparation module will have encoded therein, diffusion weighting according to the properties of the diffusion-encoding gradients. In this manner, diffusion-weighted longitudinal magnetization may be generated for diffusion tensor imaging ("DTI"), diffusion spectrum imaging ("DSI"), and high angular resolution diffusion imaging ("HARDY") techniques.

Figure 3D:
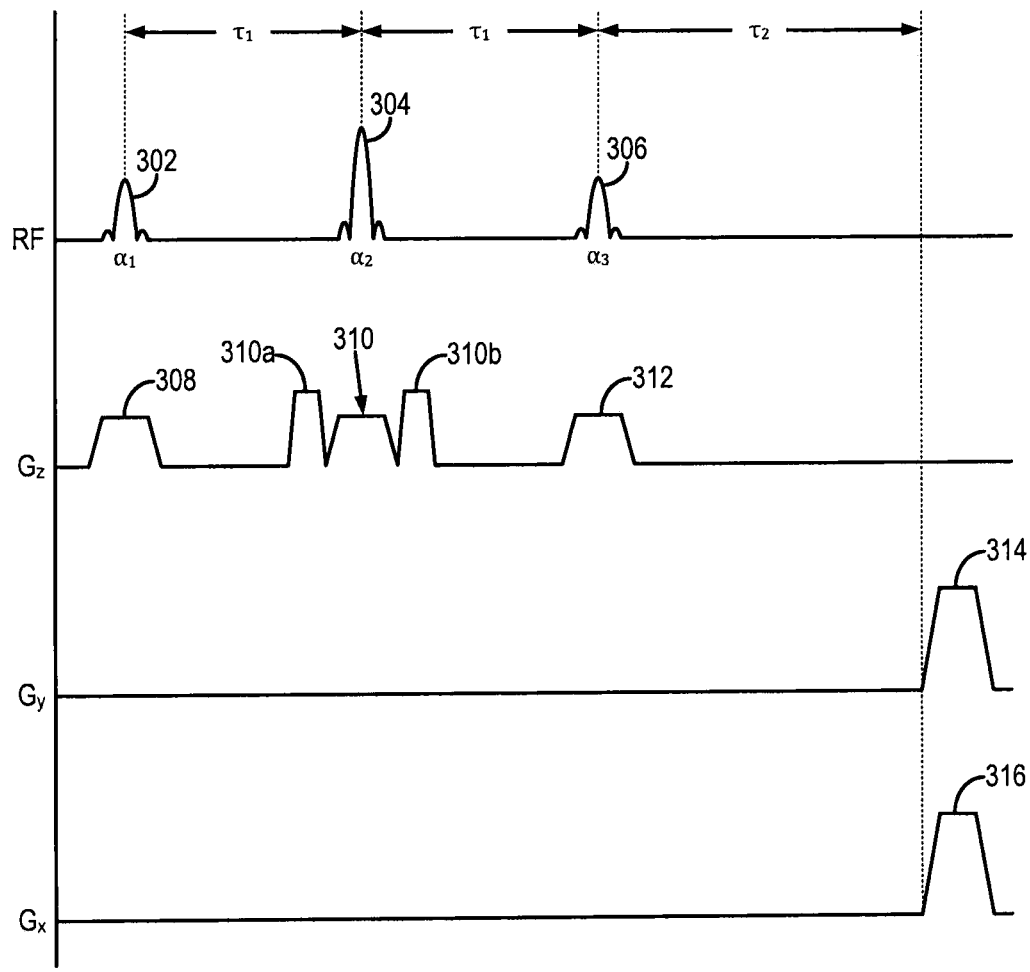
Figure 3E:
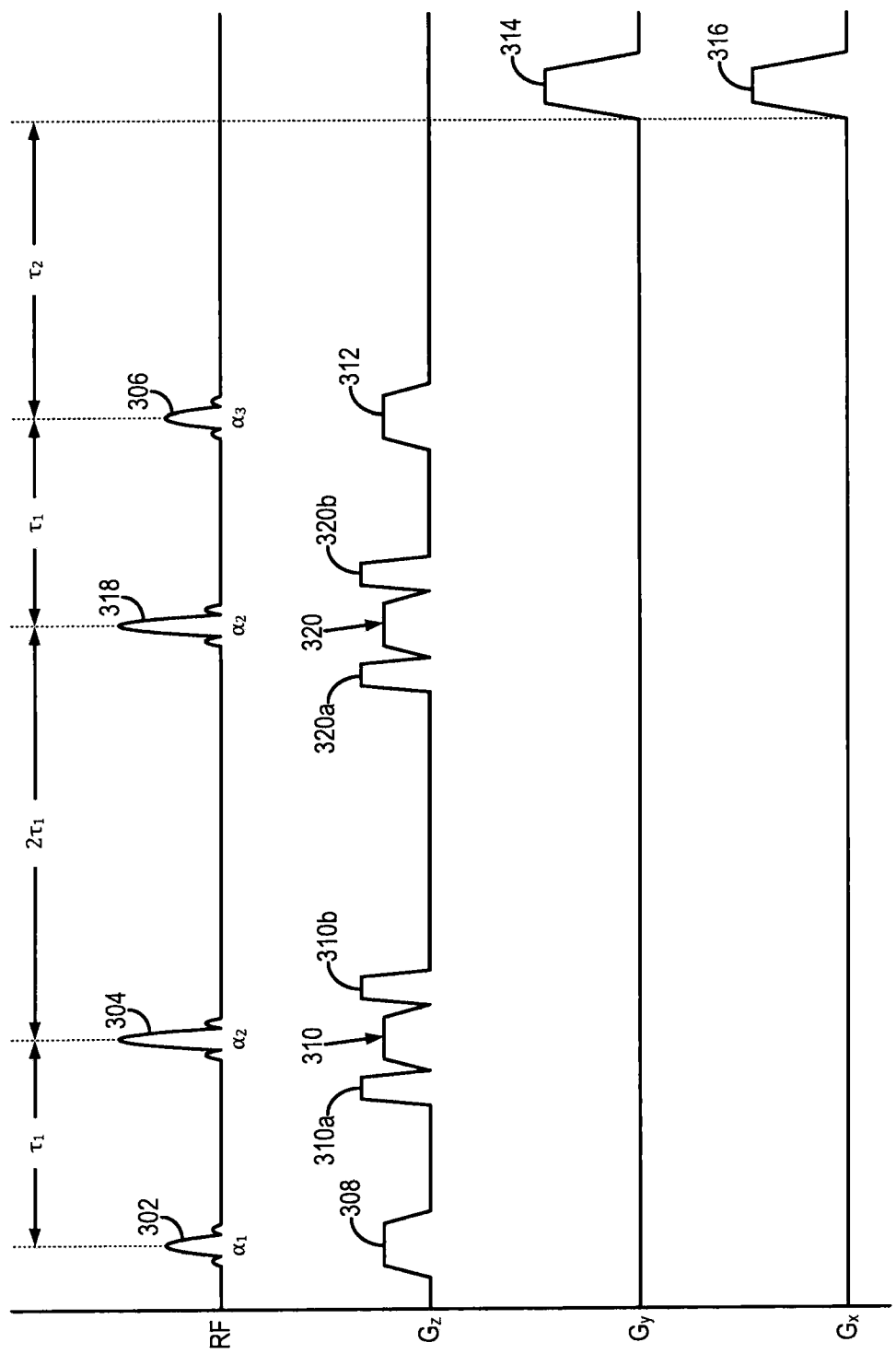

Referring now to FIGS. 3D and 3E, examples of a contrast preparation module that may be used to encode combined $T_2$-weighting and $T_1$-weighting in longitudinal magnetization is illustrated. As shown in FIG. 3D, this contrast preparation module may be substantially similar to the contrast preparation module illustrated in FIG. 3A, with the main difference being that an additional delay time period of duration $\tau_2$ is allowed to pass after the second multiband RF pulse 306 is applied, and that the second multiband RF pulse 306 rotates the magnetization through a flip angle of $\alpha_3$, and not $-\alpha_1$. The second multiband RF pulse 306 now provides a rotation of transverse magnetization so as to have a negative longitudinal component that is allowed to relax back towards thermal equilibrium during the additional delay time period. The crusher gradients 314, 316 are applied to crush any residual magnetization remaining in the transverse plane, and can be applied any time during the delay time period of duration $\tau_2$. Such a contrast preparation module may be reported as a $[\alpha_1\text{-}\tau_1\text{-}\alpha_2\text{-}\tau_1\text{-}\alpha_3\text{-}\tau_2]$ module. Preferably, $\alpha_1$ and $\alpha_3$ are both ninety degrees; however, they can also be selected such that $\alpha_1+\alpha_3=180$ degrees. In general, these flip angles are selected such that a negative longitudinal magnetization is produced after the application of the second multiband RF pulse 306. Likewise, as shown in FIG. 3E, this contrast preparation module may also be substantially similar to the contrast module illustrated in FIG. 3B, but for the same inclusion of the additional delay time period, $\tau_2$, following the second multiband RF pulse 306 and preceding the crusher gradients 314, 316. This latter contrast preparation module may be reported as a $[\alpha_1\text{-}\tau_1\text{-}(\alpha_2\text{-}2\tau_1\text{-}\alpha_2)_n\text{-}\tau_1\text{-}\alpha_3\text{-}\tau_2]$ module for integer values of n, n=1, 2, ... N. In such preparations, the transverse magnetization is first $T_2$-weighted, and then $T_1$-weighted.

Contrast preparations such as those illustrated in FIGS. 3D and 3E may be beneficial for functional magnetic resonance imaging ("fMRI") because both blood flow and $T_2$-weighting are sensitive to alterations in neuronal activity and because, in the presence of blood flow, the delay time period of duration $\tau_2$ will impart sensitivity to blood flow as well as natural $T_1$-relaxation. In fMRI, a time series of images in the presence and absence of a task or stimulus that alters neuronal activity is obtained. The intrinsic relaxation processes that contribute to $T_1$-weighting remain unaltered by the neuronal activity, but the blood flow and $T_2$-weighting change with the neuronal activity state.

Figure 3F:
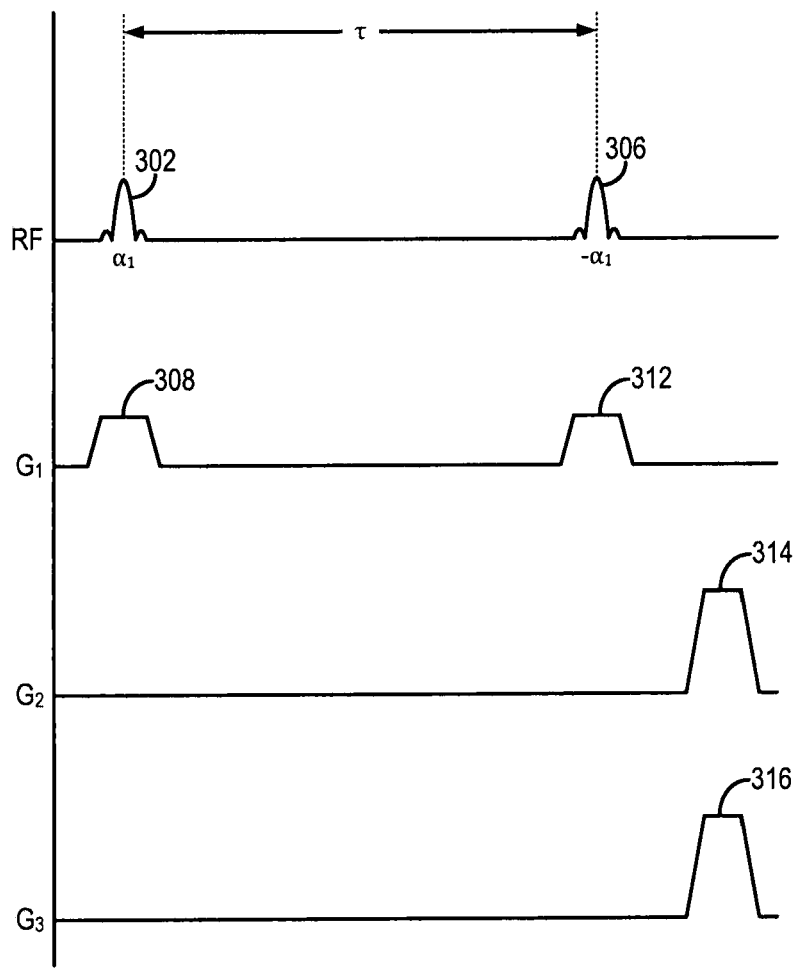

Referring now to FIG. 3F, an example of a contrast preparation module that may be used to encode $T_2^*$-weighting in longitudinal magnetization is illustrated. The contrast module begins with the application of a first multiband RF pulse 302 having a flip angle, a. As noted above, the first multiband RF pulse 302 is configured to simultaneously rotate the bulk magnetization in a plurality of subvolumes of a volume-of-interest. Again, such subvolumes generally contain multiple slice locations each. After a delay period, $\tau$, a second multiband RF pulse 306, having a flip angle of $-\alpha$ degrees, is applied; thus, the second multiband RF pulse 306 is equal to the first multiband RF pulse 302, but applied with a 180 degree phase shift. This second multiband RF pulse 306 is applied to the same subvolumes as the first multiband RF pulse 302. This contrast module may be reported as a $[\alpha\text{-}\tau\text{-}(-\alpha)]$ module. Similar to the contrast preparation module illustrated in FIG. 3A, the first multiband RF pulse 302 and the second multiband RF pulse 306 are played out in the presence of selective gradients 308 and 312, respectively.

If significant $B_1$ inhomogeneities exist, the aforementioned contrast preparation modules can be revised to include adiabatic pulses. Because the transmit $B_1$ field, $B_1^+$, is often spatially non-uniform, especially at high $B_0$ field strengths, and because for conventional RF pulses the flip angle is directly proportional to $B_1^+$, in the presence of $B_1$ field inhomogeneities the contrast preparation will be spatially non-uniform, thereby degrading image quality. This problem can be solved by various approaches, as will be described now in detail.

By way of example, the multiband refocusing RF pulses 304, 318 in FIGS. 3A and 3B can be replaced with adiabatic multiband refocusing pulses to improve performance of the contrast preparation module. Because the multiband refocusing pulses are a critical part of the contrast preparation, and because achieving $B_1^+$ insensitive refocusing is paramount for image quality, it may be advantageous to utilize these adiabatic multiband pulses.

As another example, adiabatic multiband inversion pulses can be used in lieu of the multiband refocusing RF pulses. It is worth noting that while both adiabatic refocusing pulses and adiabatic inversion pulses provide an inversion of magnetization along the longitudinal axis, only the former also provide a refocusing of transverse magnetization. When adiabatic inversion pulses are used, it is preferable that the contrast preparation module illustrated in FIG. 3B be used, or that the $[\alpha_1\text{-}\tau\text{-}(\alpha_2 2\tau\text{-}\alpha_2)_n\text{-}\tau\text{-}(-\alpha_1)]$ preparation, with $n \geq 1$, be used. Each adiabatic multiband inversion pulse is, by itself, not a "refocusing" pulse because adiabatic multiband inversion pulses induce phase dispersion. However, two of these pulses together compensate for this phase dispersion, thereby achieving a true "refocusing" pulse. One important property of the adiabatic multiband inversion pulses is their frequency selectivity profile. This frequency selectivity profile allows for the adiabatic inversion pulses to be used for a slab-selection during the contrast preparation. Adiabatic multiband refocusing pulses based on the $B_1$-independent rotation ("BIR") principle do not have this frequency selectivity.

Further $B_1^+$ insensitivity can also be achieved by using adiabatic half passage excitation and adiabatic half passage in reverse for the first multiband RF pulse and second multiband RF pulse 302, 306, respectively. In this configuration, the first multiband refocusing RF pulse 304 and second multiband refocusing RF pulse 318, where appropriate, should also be replaced by either adiabatic multiband refocusing pulses or adiabatic multiband inversion pulses.

It is worth noting that a particular type of BIR pulse, the BIR-4 pulse, may advantageously employed in lieu of some of the preceding contrast preparation modules. Particularly, a segmented BIR-4 pulse may be specifically constructed to achieve a substantially similar result as the contrast preparation modules illustrated at least in FIGS. 3A and 3B. These succeeding BIR-4 pulses may be single-band pulses or multiband pulses with the appropriate choice in spatial-selectivity and image encoding being made depending on whether they are single-band or multiband.

Figure 4A:
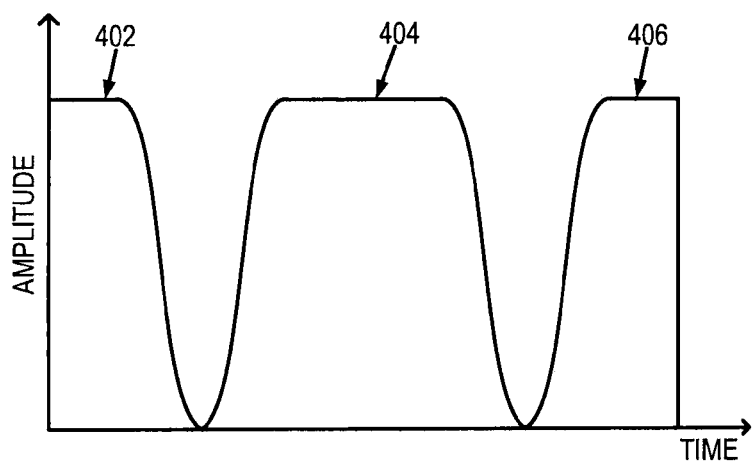
FIGS. 4A-4C are pictorial representations of a BIR-4 adiabatic RF pulse, a segmented BIR-4 adiabatic RF pulse including three pulse components, and a segmented BIR-4 adiabatic RF pulse including four pulse components, respectively.

As illustrated in FIG. 4A, a BIR-4 pulse generally includes three segments, which can be thought of as a first rotation segment 402, a refocusing segment 404, and second rotation segment 406. By way of example, the first and second rotation segments may result in a ninety degree flip angle, and in which the phase of the first rotation segment 402 is opposite in polarity of the phase in the second rotation segment 406. Preferably, the refocusing segment 404 achieves a flip angle of 180 degrees; however, as discussed above other flip angles, such as 120 degrees, may also be achieved even if such flip angles result in non-optimal refocusing. Phase shifts between the segments determine the actual rotation imposed on the magnetization. When the adiabatic condition is fulfilled, the BIR-4 pulse is $B_1$ insensitive with respect to the transformation imparted on the spins. This insensitivity is advantageous for overcoming $B_1^+$ inhomogeneities, which become problematic at high $B_0$ field strengths, such as at or above 3T.

Figure 4B:
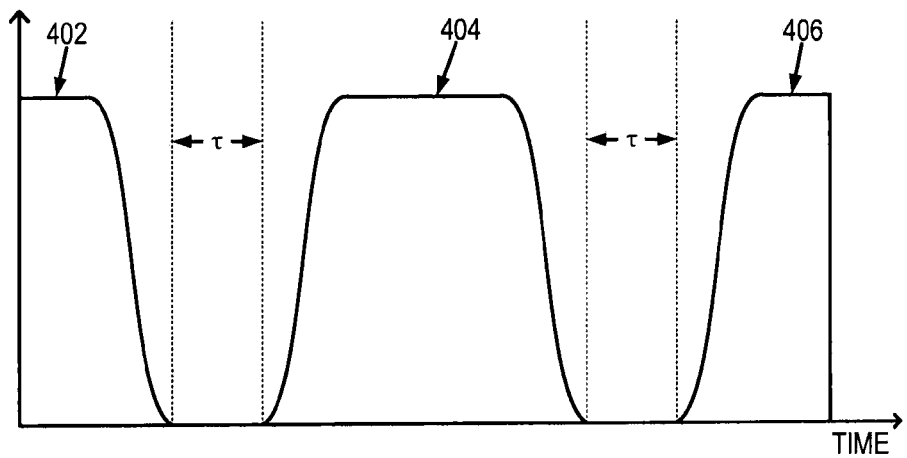
Figure 4C:
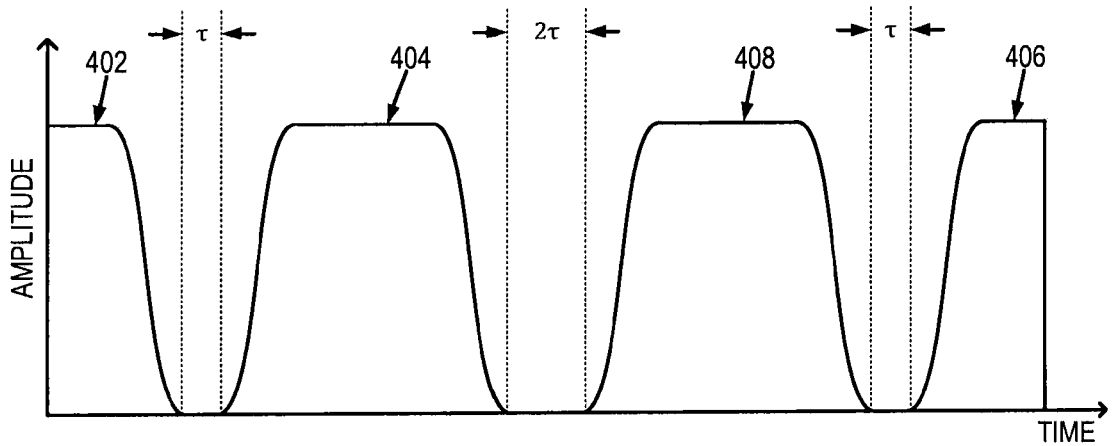

As illustrated in FIG. 4B, the segments of the BIR-4 pulse can have delays imposed between them. In these instances, the BIR-4 pulses may be reported as $[\alpha_1\text{-}\tau\text{-}\alpha_2\text{-}\tau\text{-}(-\alpha_1)]$ pulses. The phases of the segments can be adjusted so that the BIR-4 pulse achieves a zero-degree or 360-degree transformation. The result of using such a pulse looks similar to the net effect of the contrast module illustrated above in FIG. 3A. However, in the BIR-4 case, the pulse segments are complex pulses and need each other to work together. Unlike the contrast preparation module illustrated above in FIG. 3A, however, using the BIR-4 achieves the similar result irrespective of $B_1$ inhomogeneities. The BIR-4 pulse can also be configured to mimic the results of the contrast preparation module illustrated above in FIG. 3B. An example of such a BIR-4 pulse is illustrated in FIG. 4C, and includes four segments and may be reported as a $[\alpha_1\text{-}\tau\text{-}(\alpha_2\text{-}2\tau\text{-}\alpha_2)_n\text{-}\tau\text{-}(-\alpha_1)]$ pulse, where n is again an integer.

Thus, one of the preceding segmented BIR-4 pulses may be employed as a contrast preparation module in its entirety. In such instances, it will still be preferable to apply crusher gradients in the transverse plane to crush any residual transverse magnetization that remains after application of the segmented BIR-4 pulse.

Following the performance of one of the preceding contrast preparation modules, an image encoding pulse sequence module is performed. The image encoding pulse sequence module will preferably acquire image data rapidly over a desired volume of interest. An example of such a volume of interest is a whole human brain.

As stated above, the strategy with the choice of image encoding module is to acquire two-dimensional images as rapidly as possible. Thus, excitation is performed to substantially simultaneously acquire image data from multiple slice locations, thereby significantly reducing the time required for data acquisition. This may be accomplished, for example, using multiband ("MB") imaging techniques or simultaneous image refocusing ("SIR") techniques. Data acquisition times may be even further reduced by combining MB and SIR techniques to acquire image data from multiple slice locations during each by forming temporally distinct echo signals for these slice locations during the gradient readout. In this manner, an overall acceleration of $N_{MB} \times N_{SIR}$ can be achieved, where $N_{MB}$ is the number of slice locations substantially simultaneously excited with a multiband RF excitation and $N_{SIR}$ is the number of distinct RF pulses executed consecutively in time during the image encoding pulse sequence. In the MB-SIR combination, each of these aforementioned RF pulses if a multiband RF pulse. As alluded to above, the number of slice locations that can be adequately sampled by the image encoding module will depend, in general, on the $T_1$ of the spins. For example, if the $T_1$ value of the spins is 1.5 seconds, multiple slices may be acquired within, for example, a 150-300 millisecond period of time without significant impact on the image contrast prepared by the contrast preparation module, and stored in the longitudinal magnetization. If the desired image contrast is only that which is encoded in the longitudinal magnetization following performance of the contrast preparation module, then the image encoding module should include substantially no contrast preparation. It is noted, however, that it is unlikely to remove all additional contrast preparation effects because the spatial encoding process may result in the accrual of some additional contrast. If such additional contrast does accrue, it can be minimized or accounted for by additional images, such as by acquiring images with and without the contrast preparation module, but using the same image encoding module. The resultant sets of images can then be appropriately combined to remove the effects of the secondary contrast. For example, the images may be subtracted or divided.

During data acquisition, it may be advantageous to minimize the echo train length. Thus, k-space can be undersampled in accordance with parallel imaging techniques, for example by reducing the number of phase encoding lines, and an image reconstruction technique such as SENSE or GRAPPA may be used to overcome the aliasing artifacts otherwise introduced by such undersampling. If readout and phase encoding is employed in k-space coverage as in echo planar imaging ("EPI") for the image encoding module, then half-Fourier approached may also be useful for minimizing the echo train length. A discussion of several different examples of image encoding modules that may be suitable when practicing methods of the present invention is now provided.

By way of example, single-shot, slice-selective two-dimensional EPI or spiral acquisitions may be utilized in the image encoding module. Likewise, similarly fast single-shot two-dimensional image acquisitions may be used. In general, these acquisitions should be applied as rapidly as possible from one slice location to the next. As mentioned above, the number of slices that can be covered with these techniques will depend on the $T_1$ of the spins and the time it takes to sample a single slice location. Because single-shot two-dimensional EPI or spiral acquisitions normally take about fifty milliseconds to sample a single slice location, then 3-6 slices can be acquired within 150-300 milliseconds, respectively. After this time period, the contrast preparation module would be reapplied and the image encoding module repeated. This process would be repeated until the entire desired imaging volume is covered.

To improve upon the foregoing image encoding techniques, a multiband RF excitation pulse that substantially simultaneously excites multiple slice locations can be incorporated into the data acquisition. With such an RF excitation, each image collected contains information from the multiple slice locations, rather than just a single slice location. The information pertaining to the multiple different slice locations can subsequently be separated to produce a single, unaliased image for each of the multiple slice locations. This unaliasing utilizes multiple receive channels and the spatial encoding information inherent in the use of such multiple receivers. For the number of slice locations, q, that are substantially simultaneously excited and subsequently unaliased, a q-fold acceleration of the data acquisition, relative to the single slice excitation described above, is realized. This approach can be generally referred to as multiband excitation in the slice-encoding axis to achieve spatial multiplexing.

Another way to further improve upon the data acquisition efficiency of single-slice image acquisition techniques, such as two-dimensional EPI, foregoing image encoding techniques, temporal multiplexing may be introduced alone in the slice-encoding axis. In such a scheme, the contrast preparation module is followed by an image encoding module in which time multiplexing is performed by interleaving signals from multiple different slice locations within a single echo train. Such techniques may utilize the simultaneous echo refocused ("SER"), also known as simultaneous image refocused ("SIR"); echo sifting approaches, such as those used in principles of echo shifting using a train of observations ("PRESTO") techniques; or analogous strategies. Taking the SIR example, time multiplexing is achieved by exciting, for example, p-number of slices, one after another, with minimal delay between the acquisitions. The slice locations are subsequently read out in a single echo train while assuring that the echoes for the p slices are separated in time for each slice location for each section of the echo train.

The aforementioned spatial and temporal multiplexing concepts can also be combined into a single image encoding module to further improve the data acquisition efficiency. In this instance, the contrast preparation module is followed by multi-slice image encoding module that uses time multiplexing with p RF pulses applied one after another; however, each of these RF excitation pulses is a multibanded RF pulse that substantially simultaneously excites q slice locations. Thus, compared to the single-shot, single-slice acquisition, this temporally and spatially multiplexed multi-slice data acquisition will realize a p×q fold increase in the number of imaging slices that can be acquired within the same period of time. Image encoding with the specific example of SIR and multiband multiplexing is described by Feinberg, et al., in "Multiplexed Echo Planar Imaging with Sub-second Whole Brain FMRI and Fast Diffusion Imaging."

Figure 5:
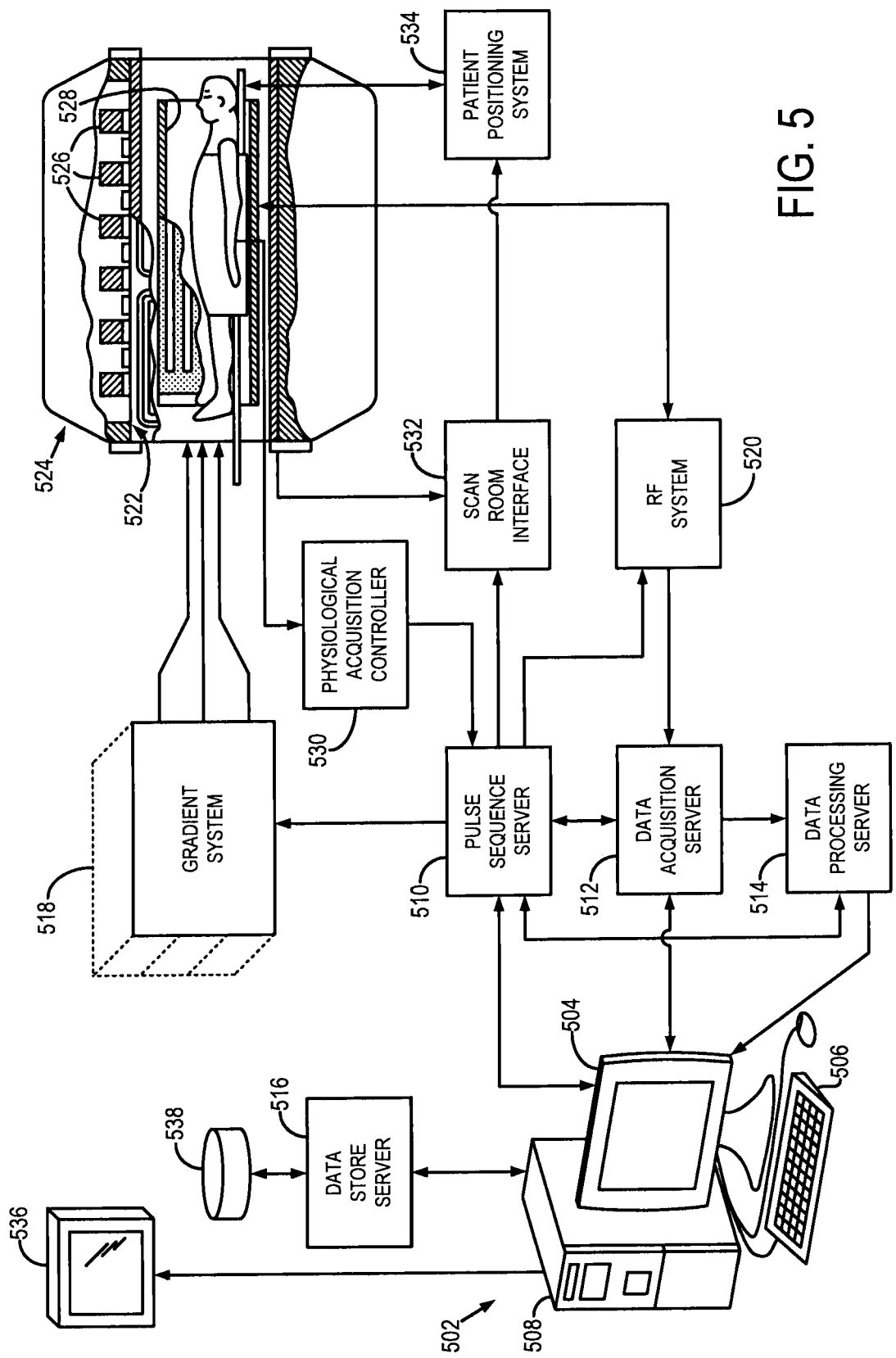
FIG. 5 is a block diagram of an example of a magnetic resonance imaging ("MRI") system.

Referring particularly now to FIG. 5, an example of a magnetic resonance imaging ("MRI") system 500 is illustrated. The MRI system 500 includes a workstation 502 having a display 504 and a keyboard 506. The workstation 502 includes a processor 508, such as a commercially available programmable machine running a commercially available operating system. The workstation 502 provides the operator interface that enables scan prescriptions to be entered into the MRI system 500. The workstation 502 is coupled to four servers: a pulse sequence server 510; a data acquisition server 512; a data processing server 514; and a data store server 516. The workstation 502 and each server 510, 512, 514, and 516 are connected to communicate with each other.

The pulse sequence server 510 functions in response to instructions downloaded from the workstation 502 to operate a gradient system 518 and a radiofrequency ("RF") system 520. Gradient waveforms necessary to perform the prescribed scan are produced and applied to the gradient system 518, which excites gradient coils in an assembly 522 to produce the magnetic field gradients $G_x$, $G_y$, and $G_z$ used for position encoding MR signals. The gradient coil assembly 522 forms part of a magnet assembly 524 that includes a polarizing magnet 526 and a whole-body RF coil 528.

RF excitation waveforms are applied to the RF coil 528, or a separate local coil (not shown in FIG. 5), by the RF system 520 to perform the prescribed magnetic resonance pulse sequence. Responsive MR signals detected by the RF coil 528, or a separate local coil (not shown in FIG. 5), are received by the RF system 520, amplified, demodulated, filtered, and digitized under direction of commands produced by the pulse sequence server 510. The RF system 520 includes an RF transmitter for producing a wide variety of RF pulses used in MR pulse sequences. The RF transmitter is responsive to the scan prescription and direction from the pulse sequence server 510 to produce RF pulses of the desired frequency, phase, and pulse amplitude waveform.

The generated RF pulses may be applied to the whole body RF coil 528 or to one or more local coils or coil arrays (not shown in FIG. 5).

The RF system 520 also includes one or more RF receiver channels. Each RF receiver channel includes an RF preamplifier that amplifies the MR signal received by the coil 528 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \qquad (3);$$

and the phase of the received MR signal may also be determined:

$$\varphi = \tan^{-1}\left(\frac{Q}{I}\right). \qquad (4)$$

The pulse sequence server 510 also optionally receives patient data from a physiological acquisition controller 530. The controller 530 receives signals from a number of different sensors connected to the patient, such as electrocardiograph ("ECG") signals from electrodes, or respiratory signals from a bellows or other respiratory monitoring device. Such signals are typically used by the pulse sequence server 510 to synchronize, or "gate," the performance of the scan with the subject's heart beat or respiration.

The pulse sequence server 510 also connects to a scan room interface circuit 532 that receives signals from various sensors associated with the condition of the patient and the magnet system. It is also through the scan room interface circuit 532 that a patient positioning system 534 receives commands to move the patient to desired positions during the scan.

The digitized MR signal samples produced by the RF system 520 are received by the data acquisition server 512. The data acquisition server 512 operates in response to instructions downloaded from the workstation 502 to receive the real-time MR data and provide buffer storage, such that no data is lost by data overrun. In some scans, the data acquisition server 512 does little more than pass the acquired MR data to the data processor server 514. However, in scans that require information derived from acquired MR data to control the further performance of the scan, the data acquisition server 512 is programmed to produce such information and convey it to the pulse sequence server 510. For example, during prescans, MR data is acquired and used to calibrate the pulse sequence performed by the pulse sequence server 510. Also, navigator signals may be acquired during a scan and used to adjust the operating parameters of the RF system 520 or the gradient system 518, or to control the view order in which k-space is sampled. In all these examples, the data acquisition server 512 acquires MR data and processes it in real-time to produce information that is used to control the scan.

The data processing server 514 receives MR data from the data acquisition server 512 and processes it in accordance with instructions downloaded from the workstation 502. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 514 are conveyed back to the workstation 502 where they are stored. Real-time images are stored in a data base memory cache (not shown in FIG. 5), from which they may be output to operator display 512 or a display 536 that is located near the magnet assembly 524 for use by attending physicians. Batch mode images or selected real time images are stored in a host database on disc storage 538. When such images have been reconstructed and transferred to storage, the data processing server 514 notifies the data store server 516 on the workstation 502. The workstation 502 may be used by an operator to archive the images, produce films, or send the images via a network to other facilities.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for simultaneously acquiring image data from a plurality of slice locations in a subject with a magnetic resonance imaging (MRI) system, the steps of the method comprising:
    acquiring image data simultaneously from a plurality of slice locations contained in a plurality of subvolumes of a volume-of-interest in a subject by directing an MRI system to perform a pulse sequence that includes:
    a) performing a contrast preparation module configured to generate contrast-prepared magnetization simultaneously in the plurality of subvolumes by applying at least one multiband radio frequency (RF) pulse to the volume-of-interest;
    b) performing an image encoding module configured to acquire image data simultaneously from the plurality of slice locations contained in the plurality of subvolumes, the acquired image data having an image contrast indicated by the contrast-prepared magnetization; and
    reconstructing at least one image from the acquired image data, wherein the at least one image includes contrast indicated by the contrast-prepared magnetization.

2. The method as recited in claim 1 in which the contrast-prepared magnetization generated in step a) is contrast-prepared longitudinal magnetization, and in which step a) includes applying the at least one multiband RF pulse to the volume-of-interest to:
    i) tip longitudinal magnetization in the plurality of subvolumes into a transverse plane to produce transverse magnetization;
    ii) generate contrast-prepared transverse magnetization by establishing an image contrast in the transverse magnetization; and
    iii) tip the contrast-prepared transverse magnetization in the plurality of subvolumes back along a longitudinal axis to produce the contrast-prepared longitudinal magnetization.

3. The method as recited in claim 1 in which the image encoding module performed in step b) includes spatially multiplexing magnetic resonance signals from the plurality of slice locations.

4. The method as recited in claim 3 in which spatially multiplexing the magnetic resonance signals includes applying at least one multiband RF excitation pulse to simultaneously excite each of the plurality of slice locations.

5. The method as recited in claim 1 in which the image encoding module performed in step b) includes temporally multiplexing magnetic resonance signals from the plurality of slice locations.

6. The method as recited in claim 4 in which temporally multiplexing the magnetic resonance signals includes performing a simultaneous image refocusing (SIR).

7. The method as recited in claim 1 in which the image encoding module performed in step b) includes spatially multiplexing magnetic resonance signals from the plurality of slice locations and temporally multiplexing magnetic resonance signals from the plurality of slice locations.

8. The method as recited in claim 1 in which the contrast preparation module performed in step a) includes:
applying a first multiband RF pulse that rotates longitudinal magnetization in the plurality of subvolumes by a flip angle into a transverse plane to produce transverse magnetization;
waiting a first time period having a duration equal to a preselected delay time;
applying a multiband refocusing RF pulse to refocus the transverse magnetization in the plurality of subvolumes;
waiting a second time period having a duration equal to the preselected delay time, thereby producing contrast-prepared transverse magnetization in the plurality of subvolumes; and
applying a second multiband RF pulse having the flip angle and a one-hundred eighty degree phase shift relative to the first multiband RF pulse, so that the contrast-prepared transverse magnetization is tipped back along a longitudinal axis to produce contrast-prepared longitudinal magnetization in the plurality of subvolumes.

9. The method as recited in claim 8 in which the contrast preparation module performed in step b) further includes applying diffusion-encoding gradients during the first and second time periods so that the contrast-prepared transverse magnetization is diffusion-weighted transverse magnetization.

10. The method as recited in claim 1 in which the contrast preparation module performed in step a) includes:
applying a first multiband RF pulse that rotates longitudinal magnetization in the plurality of subvolumes by a flip angle into a transverse plane to produce transverse magnetization;
waiting a first time period having a duration equal to a preselected delay time;
applying a first multiband refocusing RF pulse to refocus the transverse magnetization in the plurality of subvolumes;
waiting a second time period having a duration equal to twice the preselected delay time;
applying a second multiband refocusing RF pulse to refocus the transverse magnetization in the plurality of subvolumes;
waiting a third time period having a duration equal to the preselected delay time, thereby producing contrast-prepared transverse magnetization in the plurality of subvolumes; and
applying a second multiband RF pulse having the flip angle and a one-hundred eighty degree phase shift relative to the first multiband RF pulse, so that the contrast-prepared transverse magnetization is tipped back along a longitudinal axis to produce contrast-prepared longitudinal magnetization in the plurality of subvolumes.

11. The method as recited in claim 10 in which the first multiband refocusing RF pulse, the second time period, and the second multiband refocusing RF pulse are repeated a plurality of times before waiting the third time period.

12. The method as recited in claim 10 in which the first and second multiband refocusing RF pulses are both at least one of adiabatic multiband refocusing RF pulses and adiabatic multiband inversion RF pulses.

13. The method as recited in claim 1 in which the at least one multiband RF pulse in the contrast preparation module is a segmented adiabatic multiband B1-independent rotation RF pulse.

14. The method as recited in claim 13 in which the segmented adiabatic multiband B1-independent rotation RF pulse includes a first component, a first delay time period, a second component, a second delay time period, and a third component, wherein:
the first component rotates longitudinal magnetization in the plurality of subvolumes into a transverse plane to produce transverse magnetization;
the second component refocuses the transverse magnetization; and
the third component rotates the transverse magnetization back along a longitudinal axis.

15. The method as recited in claim 14 in which the segmented adiabatic multiband B1-independent rotation RF pulse includes a first component, a first delay time period, a second component, a second delay time period, a third component, a third delay time period, and a fourth component, wherein:
the first component rotates longitudinal magnetization in the plurality of subvolumes into a transverse plane to produce transverse magnetization;
the second component and the third component both refocus the transverse magnetization; and
the fourth component rotates the transverse magnetization back along a longitudinal axis.

16. The method as recited in claim 1 in which the contrast preparation module performed in step a) includes:
applying a first multiband RF pulse that rotates longitudinal magnetization in the plurality of subvolumes by a flip angle into a transverse plane to produce transverse magnetization;
waiting a first time period having a duration equal to a preselected delay time;
applying a multiband refocusing RF pulse to refocus the transverse magnetization in the plurality of subvolumes;
waiting a second time period having a duration equal to the preselected delay time, thereby producing contrast-prepared transverse magnetization in the plurality of subvolumes;
applying a second multiband RF pulse having the flip angle and a one-hundred eighty degree phase shift relative to the first multiband RF pulse, so that the contrast-prepared transverse magnetization is tipped back along a longitudinal axis to produce contrast-prepared longitudinal magnetization in the plurality of subvolumes; and
waiting a third time period having a duration equal to another delay time, so as to establish additional image contrast in the contrast-prepared longitudinal magnetization.

17. The method as recited in claim 1 wherein reconstructing the at least one image from the acquired image data includes reconstructing an image for each of the plurality of slice locations, each image having an image contrast indicated by the contrast-prepared magnetization.

18. A magnetic resonance imaging (MRI) system, comprising:
   a magnet system configured to generate a polarizing magnetic field about at least a portion of a subject arranged in the MRI system;
   a plurality of gradient coils configured to apply at least one gradient field to the polarizing magnetic field;
   a radio frequency (RF) system configured to apply an RF field to the subject and to acquire magnetic resonance (MR) image data therefrom;
   a computer system programmed to:
      direct the MRI system to perform a contrast preparation pulse sequence module that generates contrast-prepared magnetization simultaneously in a plurality of subvolumes in a volume-of-interest by directing the RF system to apply at least one multiband RF pulse to the volume-of-interest and the plurality of gradient coils to apply the at least one gradient field to the polarizing magnetic field so that the at least one multiband RF pulse generates the contrast-prepared magnetization in the plurality of subvolumes; and
      direct the MRI system to perform an image encoding pulse sequence module that acquires image data simultaneously from a plurality of slice locations contained in the plurality of subvolumes, the acquired image data having an image contrast indicated by the contrast-prepared magnetization.

19. The MRI system as recited in claim 18 in which the computer system is programmed to direct the MRI system to perform the image encoding pulse sequence module by directing the RF system to apply at least one multiband RF excitation pulse to the volume-of-interest and by directing the plurality of gradient coils to apply the at least one gradient field to the polarizing magnetic field so that the at least one multiband RF excitation pulse excites the plurality of slice locations.

* * * * *

UNITED STATES PATENT AND TRADEMARK OFFICE
CERTIFICATE OF CORRECTION

PATENT NO. : 9,915,717 B2
APPLICATION NO. : 13/995869
DATED : March 13, 2018
INVENTOR(S) : Kamil Ugurbil It is certified that error appears in the above-identified patent and that said Letters Patent is hereby corrected as shown below:

In the Specification

Column 7, Line 48, "$[\alpha_1\text{-}T\text{-}(\alpha_2\text{-}2\tau\text{-}\alpha_2)_n\text{-}\tau\text{-}(\text{-}\alpha_1)]$" should be --$[\alpha_1\text{-}\tau\text{-}(\alpha_2\text{-}2\tau\text{-}\alpha_2)_n\text{-}\tau\text{-}(\text{-}\alpha_1)]$--.

Column 8, Line 4, "("HARDY")" should be --("HARDI")--.

Column 8, Line 55, "angle, a." should be --angle, $\alpha$.--.

Column 9, Line 29, "$[\alpha_1\text{-}\tau\text{-}(\alpha_1 2\tau\text{-}\alpha_2)_n\text{-}\tau\text{-}(\text{-}\alpha_1)]$" should be --$[\alpha_1\text{-}\tau\text{-}(\alpha_1\text{-}2\tau\text{-}\alpha_2)_n\text{-}\tau\text{-}(\text{-}\alpha_1)]$--.

Signed and Sealed this
Twenty-ninth Day of May, 2018

Andrei Iancu
*Director of the United States Patent and Trademark Office*